United States Patent
Seo et al.

(10) Patent No.: US 10,210,786 B2
(45) Date of Patent: Feb. 19, 2019

(54) DISPLAY DEVICE, METHOD OF DRIVING DISPLAY DEVICE, AND ELECTRONIC DEVICE HAVING DISPLAY DEVICE

(71) Applicant: Samsung Display Co., Ltd., Yongin-si, Gyeonggi-Do (KR)

(72) Inventors: Young-Jun Seo, Seoul (KR); Hyo-Sun Kim, Seongnam-si (KR); Soo-Yeon Lee, Seoul (KR)

(73) Assignee: Samsung Display Co., Ltd. (KR)

( * ) Notice: Subject to any disclaimer, the term of this patent is extended or adjusted under 35 U.S.C. 154(b) by 116 days.

(21) Appl. No.: 15/244,946

(22) Filed: Aug. 23, 2016

(65) Prior Publication Data

US 2017/0213491 A1   Jul. 27, 2017

(30) Foreign Application Priority Data

Jan. 21, 2016   (KR) .......................... 10-2016-0007523

(51) Int. Cl.
| | | |
|---|---|---|
| *G09G 3/20* | (2006.01) | |
| *G09G 3/3275* | (2016.01) | |
| *G09G 3/34* | (2006.01) | |

(52) U.S. Cl.
CPC ......... *G09G 3/2003* (2013.01); *G09G 3/3275* (2013.01); *G09G 3/3413* (2013.01); *G09G 2320/0242* (2013.01); *G09G 2320/0626* (2013.01); *G09G 2320/0666* (2013.01); *G09G 2360/144* (2013.01); *G09G 2360/145* (2013.01)

(58) Field of Classification Search
CPC .. G09G 3/2003; G09G 3/3275; G09G 3/3413; G09G 5/02; G09G 5/10
See application file for complete search history.

(56) References Cited

U.S. PATENT DOCUMENTS

| | | | | |
|---|---|---|---|---|
| 9,613,562 | B2 * | 4/2017 | Lee | .......................... G06T 5/009 |
| 9,842,568 | B2 * | 12/2017 | Lee | ............................ G09G 3/20 |
| 2008/0002062 | A1 * | 1/2008 | Kim | ........................ G06T 5/009 |
| | | | | 348/602 |
| 2008/0129678 | A1 * | 6/2008 | Choi | .................... G09G 3/3413 |
| | | | | 345/102 |
| 2013/0207948 | A1 * | 8/2013 | Na | .......................... G09G 3/003 |
| | | | | 345/207 |
| 2014/0043354 | A1 * | 2/2014 | Choi | ........................ G09G 5/02 |
| | | | | 345/590 |
| 2014/0063039 | A1 * | 3/2014 | Drzaic | ..................... G09G 5/02 |
| | | | | 345/589 |

(Continued)

FOREIGN PATENT DOCUMENTS

KR   10-2012-0069363 A   6/2012

*Primary Examiner* — Sardis F Azongha
(74) *Attorney, Agent, or Firm* — Innovation Counsel LLP

(57) ABSTRACT

A display device includes a display panel including a plurality of pixels, a color compensator calculating a mixed color coordinate of a mixed light of an image light and an external light based on a first color coordinate of the image light, a second color coordinate of the external light, and a luminance ratio of a second luminance value of the external light to a first luminance value of the image light and compensating the first color coordinate based on the mixed color coordinate to generate an output image data, and a panel driver providing a driving signal to the display panel to display an image corresponding to the output image data.

14 Claims, 11 Drawing Sheets

(56) References Cited

U.S. PATENT DOCUMENTS

| | | | |
|---|---|---|---|
| 2014/0184577 A1* | 7/2014 | Kim | G09G 5/10 345/207 |
| 2014/0300625 A1* | 10/2014 | Chun | G09G 5/02 345/600 |
| 2014/0333656 A1* | 11/2014 | Wang | G09G 5/02 345/591 |
| 2015/0356902 A1 | 12/2015 | Seo et al. | |
| 2015/0371579 A1* | 12/2015 | Yu | G09G 3/32 345/690 |
| 2016/0104302 A1* | 4/2016 | Lee | G09G 5/02 345/592 |

\* cited by examiner

DISPLAY DEVICE, METHOD OF DRIVING DISPLAY DEVICE, AND ELECTRONIC DEVICE HAVING DISPLAY DEVICE

CROSS REFERENCE TO RELATED APPLICATION

This application claims priority under 35 U.S.C. § 119 to Korean patent Application No. 10-2016-0007523 filed on Jan. 21, 2016, the disclosure of which is hereby incorporated by reference herein in its entirety.

BACKGROUND

1. Technical Field

Example embodiments of the inventive concept relate to display devices. More particularly, example embodiments of the inventive concept relate to a display device, a method of driving the display device, and an electronic device having the display device.

2. Description of the Related Art

The transparent display device includes a pixel region emitting an image light and a transmitting region through which an external light passes. The transparent display device displays an image on the pixel region to provide information to a user. In addition, the transparent display device allows the user to see through the transmitting region to perceive what's behind the transparent display device. For example, the transparent display device is used for electronic devices for advertisement. An exhibit located backside of the transparent display device and the image displayed by the transparent display device can be recognized by user.

Because the image light emitted by the transparent display device and the external light passing through the transmitting region are recognized at the same time by user, a visibility of the transparent display device decreases according to a brightness of the external light. Accordingly, methods for improving the visibility of the transparent display device are developed. For example, the transparent display device may include a photochromic layer for absorbing the external light on a substrate or a display unit. However, in this case, a transparency of the transparent display device decreases or a recognition color gamut of mixed light recognized by user decreases because a saturation of the mixed light decreases due to the external light.

SUMMARY

Example embodiments provide a display device capable of improving a visibility of the display device.

Example embodiments provide a method of driving the display device.

Example embodiments provide an electronic device including the display device.

According to some example embodiments, a display device may include a display panel including a plurality of pixels, a color compensator configured to calculate a mixed color coordinate of a mixed light of an image light and an external light based on a first color coordinate of the image light, a second color coordinate of the external light, and a luminance ratio of a second luminance value of the external light to a first luminance value of the image light and configured to compensate the first color coordinate based on the mixed color coordinate to generate an output image data, and a panel driver configured to provide a driving signal to the display panel to display an image corresponding to the output image data.

In example embodiments, the color compensator may include a first format converter configured to convert an input image data into an input tristimulus value, a mixed color coordinate calculator configured to calculate the first color coordinate and the first luminance value based on the input tristimulus value and configured to calculate the mixed color coordinate based on the luminance ratio, the mixed color coordinate located on a line connecting the first color coordinate to the second color coordinate, a virtual color coordinate calculator configured to calculate a virtual color coordinate by adding the first color coordinate to a difference value between the first color coordinate and the mixed color coordinate, a converted tristimulus value calculator configured to calculate a converted tristimulus value based on the virtual color coordinate, and a second format converter configured to convert the converted tristimulus value into the output image data.

In example embodiments, a distance ratio of a second distance between the mixed color coordinate and the second color coordinate to a first distance between the mixed color coordinate and the first color coordinate may be inversely proportional to the luminance ratio.

In example embodiments, the mixed color coordinate calculator may receive the second color coordinate and the second luminance value from a light sensor included in the display panel.

In example embodiments, the display panel may be divided into a plurality of display regions on which a plurality of light sensors are disposed, respectively. The mixed color coordinate calculator may receive the second color coordinate and the second luminance value from the light sensors.

In example embodiments, the mixed color coordinate calculator may periodically receive the second color coordinate and the second luminance value.

In example embodiments, each of the pixels may include a pixel region having an organic light emitting diode emitting the image light, and a transmitting region having a transmitting window through which the external light passes.

In example embodiments, the mixed color coordinate calculator may adjust the second luminance value based on a transmissivity of the transmitting region.

In example embodiments, the display panel may further include a light blocking portion configured to adjust a transmissivity of the transmitting region.

In example embodiments, the display panel may be divided into a plurality of display regions. The light blocking portion may adjust the transmissivity corresponding to display regions, respectively.

In example embodiments, the virtual color coordinate calculator may adjust the virtual color coordinate by multiplying the virtual color coordinate and a gain value.

According to some example embodiments, a display device may include a pixel region emitting an image light and a transmitting region through which an external light passes. The method of driving the display device may include an operation of converting an input image data into an input tristimulus value, an operation of calculating a first color coordinate of the image light and a first luminance value of the image light based on the input tristimulus value, an operation of calculating a mixed color coordinate of a mixed light of the image light and the external light based on a luminance ratio of a second luminance value of the external light to the first luminance value, the mixed color coordinate located on a line connecting the first color coordinate to a second color coordinate of the external light, an operation of calculating a virtual color coordinate by adding the first color coordinate to a difference value between the first color coordinate and the mixed color coordinate, and an operation of generating an output image data based on the virtual color coordinate to display an image corresponding to the output image data.

In example embodiments, a distance ratio of a second distance between the mixed color coordinate and the second color coordinate to a first distance between the mixed color coordinate and the first color coordinate may be inversely proportional to the luminance ratio.

In example embodiments, the second color coordinate and the second luminance value may be derived from a light sensor included in the display device.

In example embodiments, the second color coordinate and the second luminance value may be periodically updated.

In example embodiments, the second luminance value may be adjusted based on a transmissivity of the transmitting window.

In example embodiments, the virtual color coordinate may be adjusted by multiplying the virtual color coordinate and a gain value.

According to some example embodiments, an electronic device may include a display device including a pixel region emitting an image light and a transmitting region through which a back light passes, a housing combined with the display device, a light source disposed on at least one side of the housing and configured to emit the back light, and a controller configured to control the display device and the light source. The display device may include a display panel including a plurality of pixels, a color compensator configured to calculate a mixed color coordinate of a mixed light of the image light and the back light based on a first color coordinate of the image light, a second color coordinate of the back light, and a luminance ratio of a second luminance value of the back light to a first luminance value of the image light, and configured to compensate the first color coordinate based on the mixed color coordinate to generate an output image data, and a panel driver configured to provide a driving signal to the display panel to display an image corresponding to the output image data.

In example embodiments, the controller may provide a first control signal for adjusting the second luminance value to the light source and provides the second luminance value to the display device.

In example embodiments, the display panel may further include a light blocking portion configured to adjust a transmissivity of the transmitting region. The controller may provide a second control signal for adjusting the transmissivity of the transmitting region based on the second luminance value to the display device.

Therefore, a display device and a method for driving the display device according to example embodiments calculate a mixed color coordinate of a light mixed an image light and an external light and compensate a color coordinate of the image light emitted by the display device based on the mixed color coordinate. Accordingly, the display device compensates a recognition color gamut that decreases due to the external light passing through a transmitting region, thereby preventing a saturation decrease of the mixed light and improving the visibility of the display device.

In addition, an electronic device according to example embodiments may control a light source emitting a back light and the display device such that an exhibit located backside of the display device, and an image displayed by the display device can be efficiently recognized by user.

BRIEF DESCRIPTION OF THE DRAWINGS

Exemplary embodiments are described more fully hereinafter with reference to the accompanying drawings, in which various embodiments are shown.

DESCRIPTION OF EMBODIMENTS

Exemplary embodiments are described more fully hereinafter with reference to the accompanying drawings, in which various embodiments are shown.

Figure 1:
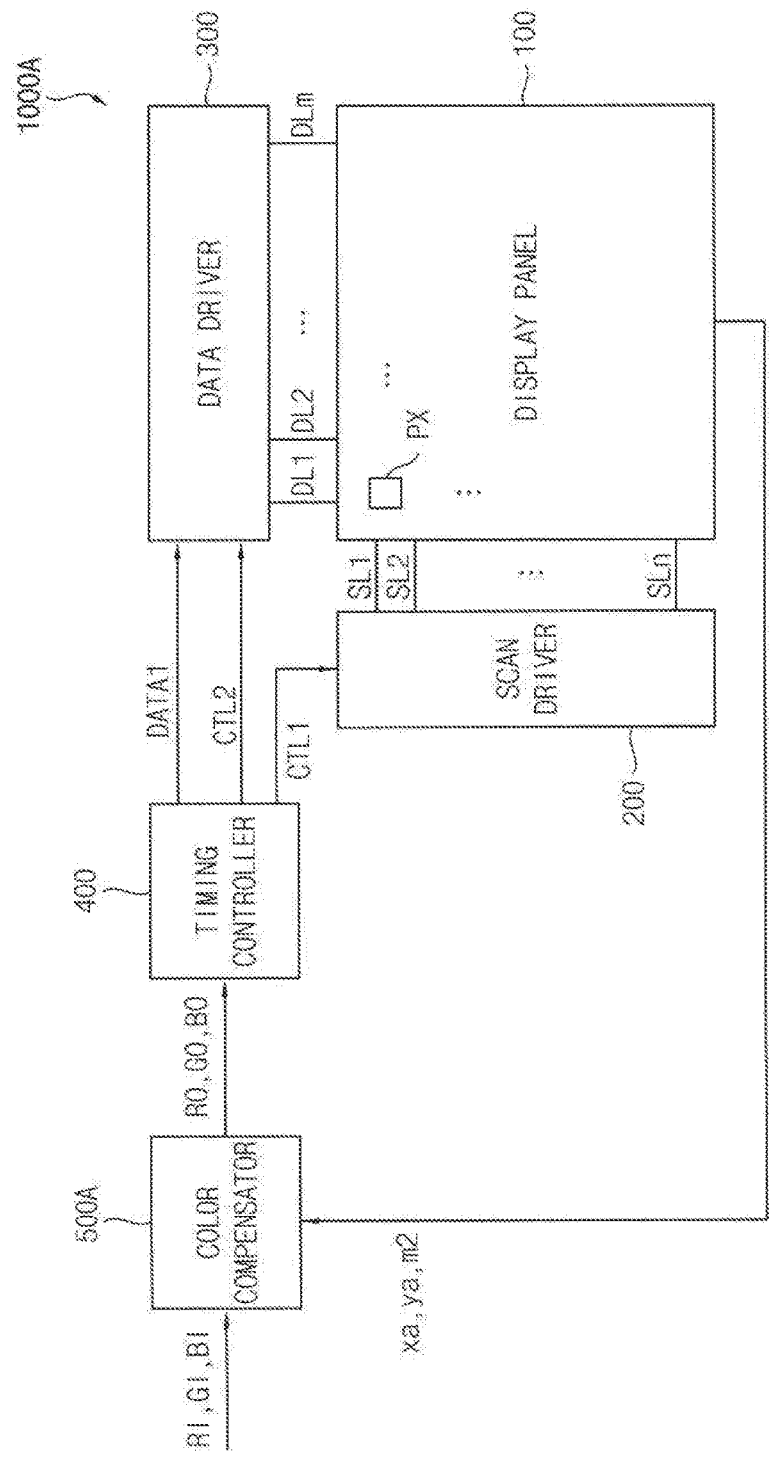
FIG. 1 is a block diagram illustrating a display device according to example embodiments.

FIG. 1 is a block diagram illustrating a display device according to example embodiments.

Referring to FIG. 1, the display device 1000A may include a display panel 100, a panel driver, and a color compensator 500A.

The display panel 100 may include a plurality of pixels PX. For example, the display panel 100 may include n*m pixels PX because the pixels PX are arranged at locations corresponding to crossing points of the scan lines SL1 through SLn and the data lines DL1 through DLm. In one example embodiment, the display panel 100 may be a transparent display panel. For example, the pixel PX may include a pixel region having an organic light emitting diode (OLED) emitting the image light and a transmitting region having a transmitting window through which an external light passes. In one example embodiment, the display panel 100 may include one or more light sensors. For example, the display panel may be divided into a plurality of display regions. A plurality of light sensors may be disposed on the display regions, respectively, to accurately sense the external light incident on the display regions.

The panel driver may provide a driving signal to the display panel 100 to display an image corresponding to the output image data (RO, GO, BO). In one example embodiment, the panel driver may include a scan driver 200, a data driver 300, and a timing controller 400. The scan driver 200 may provide a scan signal to the pixels PX via the scan lines SL1 through SLn based on a first control signal CTL1. The data driver 300 may provide a data signal to the pixels PX via the data lines DL1 through DLm based on a second control signal CTL2. The timing controller 400 may receive the output image data (RO, GO, BO) from the color compensator 500A and generate the first control signal CTL1, the second control signal CTL2, and a data signal DATA1 to display the image corresponding to the output image data (RO, GO, BO).

The color compensator 500A may compensate a recognition color gamut decreased by the external light. Here, the recognition color gamut indicates a color gamut recognized by user. For example, the recognition color gamut corresponds to a color gamut of a mixed light of the image light and the external light. The color compensator 500A may receive input image data (RI, GI, BI) and compensate a color coordinate corresponding to the input image data (RI, GI, BI) to generate the output image data (RO, GO, BO). Specially, the color compensator 500A may receive the second color coordinate (xa, ya) and the second luminance value m2 of the external light from the light sensor included in the display panel 100. The color compensator 500A may derive a first color coordinate and a first luminance value of the image light from the input image data (RI, GI, BI). The color compensator 500A may calculate a mixed color coordinate of a mixed light of the image light and the external light based on the first color coordinate, the second color coordinate (xa, ya), and a luminance ratio of the second luminance value m2 to the first luminance value. The color compensator 500A may compensate the first color coordinate based on the mixed color coordinate to generate the output image data (RO, GO, BO). Hereinafter, the color compensator 500A is described in more detail with reference to the FIG. 5.

Therefore, the display device 1000A prevents a saturation decrease that may otherwise occur due to the external light, and a visibility of the display device 1000A is improved.

Figure 2:
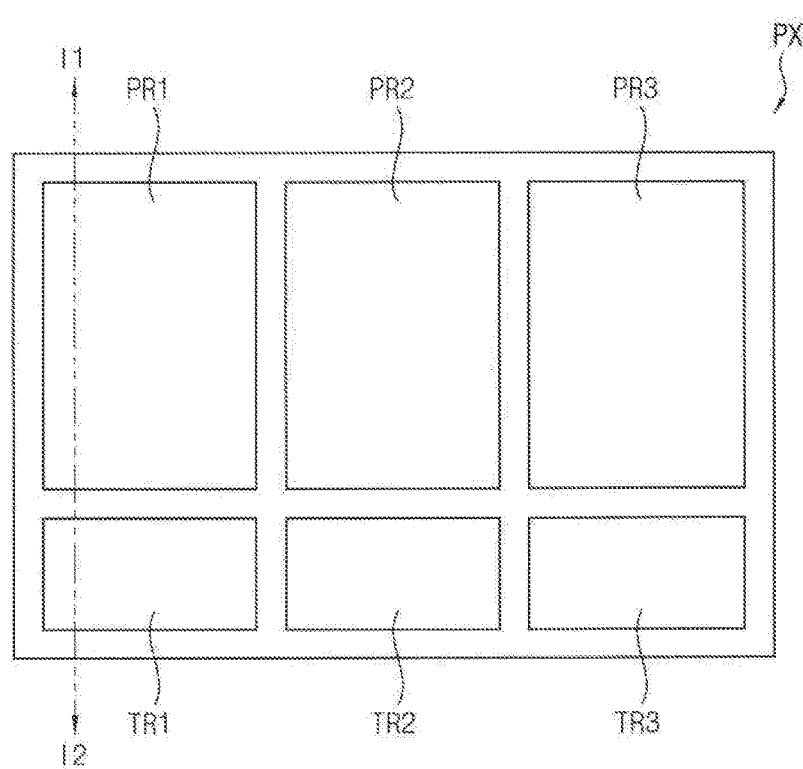
FIGS. 2 and 3 are diagrams an example of a pixel included in a display device of FIG. 1.
Figure 3:
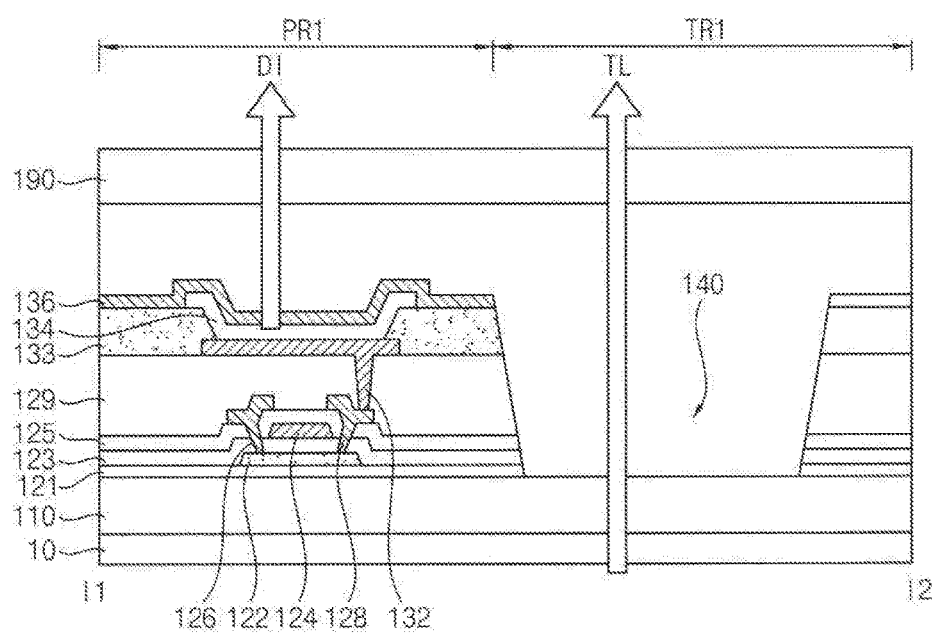
Figure 4A:
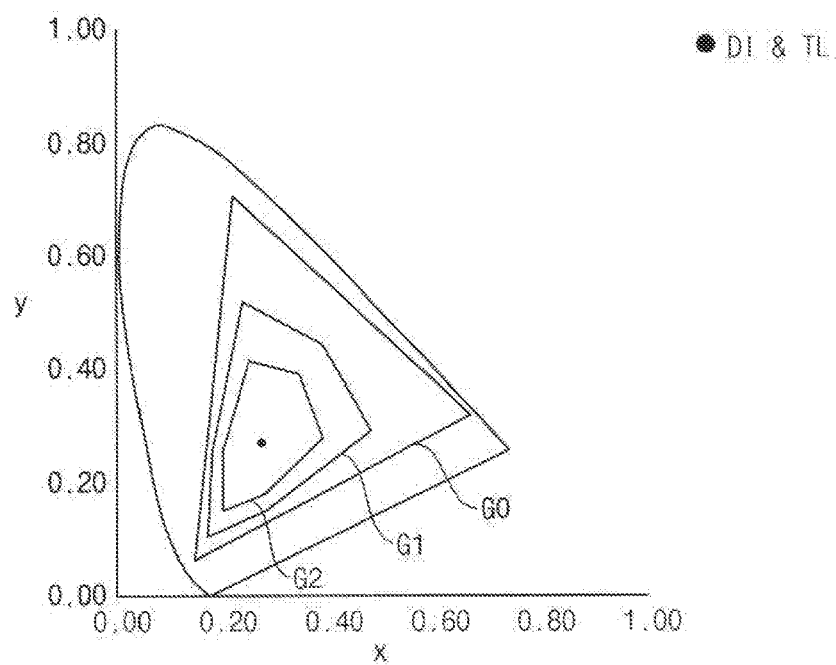
FIGS. 4A and 4B are diagrams for describing a recognition color gamut decreased by an external light.
Figure 4B:
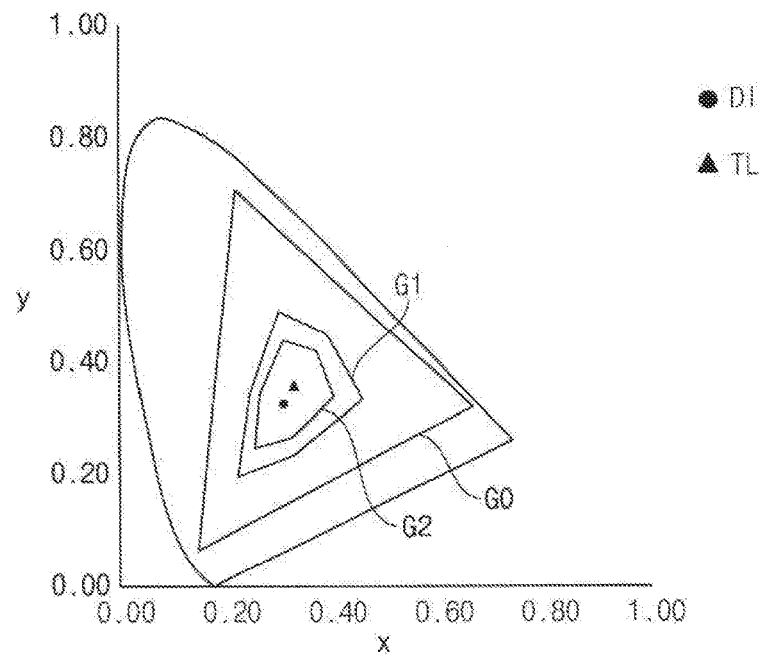

FIGS. 2 and 3 are diagrams of an example of a pixel included in a display device of FIG. 1. FIGS. 4A and 4B are diagrams for describing a recognition color gamut decreased by an external light.

Referring to FIGS. 2, 3, 4A and 4B, the pixel PX may include pixel regions PR1, PR2, PR3 having an OLED emitting the image light and transmitting regions TR1, TR2, TR3 having a transmitting window through which the external light TL passes. Therefore, the user can perceive what is behind the transmitting regions TR1, TR2, TR3 because the external light TL passes through the transmitting regions TR1, TR2, TR3.

As shown in FIG. 2, the pixel PX may include first through third pixel regions PR1, PR2, PR3 and first through third transmitting regions TR1, TR2, TR3. The OLEDs (not shown in FIG. 2) may be respectively disposed on the first through third pixel regions PR1, PR2, PR3. For example, the OLED emitting red color light may be disposed on the first pixel region PR1. The OLED emitting green color light may be disposed on the second pixel region PR2. The OLED emitting blue color light may be disposed on the third pixel region PR3. The transmitting window may be respectively disposed on the first through third transmitting regions TR1, TR2, TR3.

As shown in FIG. 3, the display device may have a variety of structures capable of transmitting the external light. For example, the display device may include a first substrate 110, a second substrate 190, a display unit, and a light sensor 10.

The first substrate 110 and the second substrate 190 may include a glass substrate or a transparent plastic substrate. The second substrate 190 may be disposed opposite to the first substrate 110. A barrier layer 121 may be formed on the first substrate 110. Moisture penetrating through the first substrate 110 may be blocked by the barrier layer 121.

The light sensor 10 may be disposed on one side of the first substrate 110 or the second substrate 190. The light sensor 10 may sense a second color coordinate and a second luminance value of the external light TL. The sensed second color coordinate and the second luminance value may be provided to the color compensator to compensate a recognition color gamut of the image light DI that decreases owing to the external light TL.

The display unit may be disposed between the first substrate 110 and the second substrate 190. The display unit may include a pixel having a sub-pixel and a transparent window 140. The sub-pixel may include a thin film transistor (TFT) and an OLED electrically connected to the TFT.

The TFT may include an active pattern 122, a gate insulation layer 123, a gate electrode 124, a source electrode 126, and a drain electrode 128. The gate insulation layer 123 may be formed on the barrier layer 121 and cover the active pattern 122. The gate electrode 124 may be formed on the gate insulation layer 123 and superimposed over the active pattern 122. An insulating interlayer 125 may be formed on the gate insulation layer 123 and cover the gate electrode 124. The source electrode 126 and the drain electrode 128 may extend through the insulating interlayer 125 and the gate insulation layer 123 to be in contact with the active pattern 122. A via insulation layer 129 may be formed on the insulating interlayer 125 and cover the source and drain electrodes 126 and 128. The via insulation layer 129 may also serve as a planarization layer of the display unit. The OLED may formed on the via insulation layer 129.

The OLED may be disposed on the pixel region PR1 and emit the image light DI to display image. The OLED may include a first electrode 132, a display layer 134, and a second electrode 136. The first electrode 132 may extend through the via insulation layer 129 and may be electrically connected to the drain electrode 128. A pixel defining layer 133 may be formed on the via insulation layer 129 to cover a peripheral portion of the first electrode 132. The display layer 134 may be formed on the first electrode 132 and the pixel defining layer 133. The display layer 134 may include an organic light emitting material. In this case, a hole transport layer (HTL) and an electron transport layer (ETL) (both not shown in FIG. 3) may be further formed under the display layer 134 and on the display layer 134, respectively. The second electrode 136 may be formed on the pixel defining layer 133 and the display layer 134.

The display unit 120 may have a transmitting window 140 in the transmitting region TR. In one example embodiment, the transmitting window 140 may be formed by removing or not forming the second electrode 136, the pixel defining layer 133, the via insulation layer 129, the insulating interlayer 125, the gate insulation layer 123, and the barrier layer 121 in the transmitting region TR.

Therefore, the user may recognize the image light DI and the external light TL at the same time because the image light DI is emitted from the pixel region PR1 and the external light TL is passed through the transmitting region TR.

As shown in FIGS. 4A and 4B, a luminance of a mixed light of the image light DI and the external light TL may be higher than a luminance of the display light DI. However, a saturation of the mixed light may be lower than a saturation of the display light DI. In other words, the recognition color gamut recognized by user may decrease.

Specially, in the CIE 1931 color space chromaticity diagram, a color gamut GO that can be displayed by the transparent display device may be smaller than a color gamut that can be recognized by an average person. When the external light TL interferes with the image light DI emitted by the transparent display device, the recognition color gamut that is recognized by user may decrease. In both of a case in which a color temperature of the image light DI equals to a color temperature of the external light TL, such as shown in FIG. 4A and a case in which the color temperature of the image light DI differs from the color temperature of the external light TL, such as shown in FIG. 4B, the recognition color gamut may decrease as the luminance of the external light TL increases. Thus, when the external light TL has the first luminance that is relatively low (e.g., indoor with low-intensity), the user may recognize the first recognition color gamut G1 that is relatively large. On the other hand, when the external light TL has the second luminance higher than the first luminance (e.g., outdoor with high-intensity), the user may recognize the second recognition color gamut G2 that is smaller than the first recognition color gamut G1.

Therefore, a visibility of the image light DI or a displayed image generally decreases as the luminance of the external light TL increases. A solution to this problem is for the display device to increase the recognition color gamut that is decreased by the external light TL using the color compensator.

Although the pixel structure of the example embodiments of FIG. 2 is described as having the first through third pixel regions and the first through third transmitting regions each corresponding to the pixel regions, the structure of the pixel is not limited thereto. For example, the pixel may include the first through third pixel regions and one transmitting region to broaden the transmitting region.

Although the light sensor of the example embodiments of FIG. 3 is described as being disposed under the first substrate, the location of the light sensor is not limited thereto. In one example, the light sensor may be disposed on one side of the second substrate. In another example, the light sensor may be located outside of the display device.

Although the transmitting window of the example embodiments of FIG. 3 is described as being formed by removing or not forming the second electrode, the pixel defining layer, the via insulation layer, the insulating interlayer, the gate insulation layer, and the barrier layer in the transmitting region, it is not limited thereto. For example, the transmitting window may be formed by removing or not forming the second electrode in the transmitting region or by removing or not forming the pixel defining layer and the via insulation layer in the transmitting region.

Figure 5:
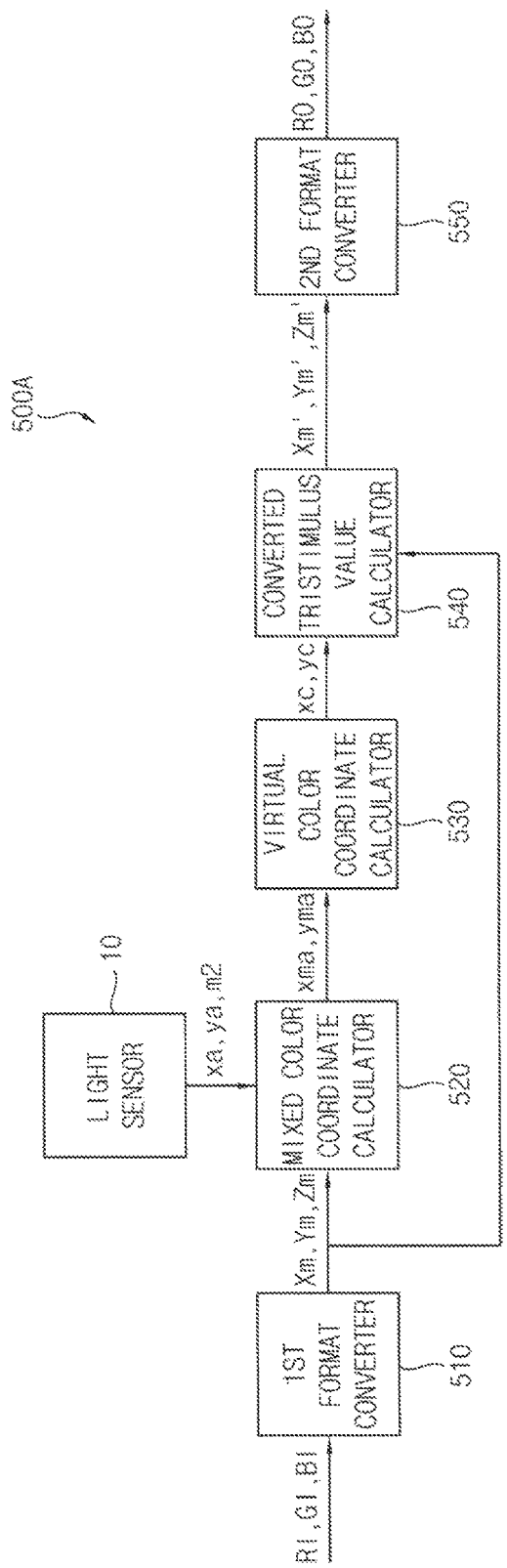
FIG. 5 is a block diagram illustrating an example of a color compensator included in a display device of FIG. 1.
Figure 6:
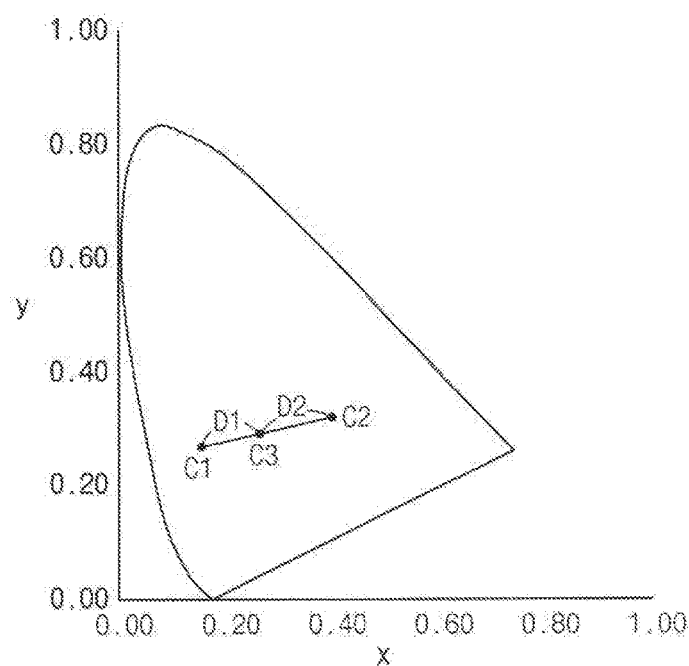
FIG. 6 is a diagram for describing a method of calculating a mixed color coordinate of a mixed light.
Figure 7:
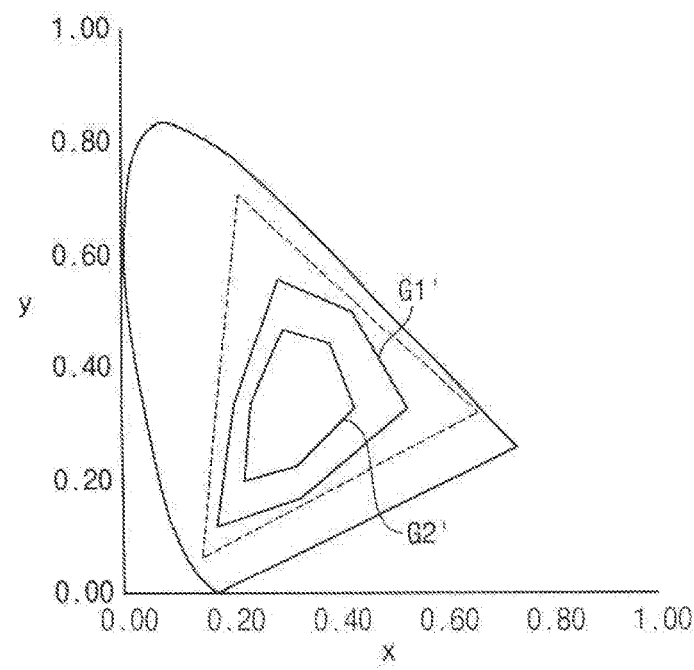
FIG. 7 is a diagram for describing a method of compensating a recognition color gamut decreased by an external light based on a mixed color coordinate.

FIG. 5 is a block diagram illustrating an example of a color compensator included in a display device of FIG. 1. FIG. 6 is a diagram for describing a method of calculating a mixed color coordinate of a mixed light. FIG. 7 is a diagram for describing a method of compensating a recognition color gamut decreased by an external light based on a mixed color coordinate.

Referring to FIGS. 5 through 7, the color compensator 500A may include a first format converter 510, a mixed color coordinate calculator 520, a virtual color coordinate calculator 530, a converted tristimulus value calculator 540, a second format converter 550.

The first format converter 510 may convert an input image data (RI, GI, BI) into an input tristimulus value (Xm, Ym, Zm). In one example embodiment, the input image data (RI, GI, BI) may correspond to RGB format and may be converted into the input tristimulus value (Xm, Ym, Zm) using a conversion matrix. For example, the first format converter 510 may convert the input image data (RI, GI, BI) into the input tristimulus value (Xm, Ym, Zm) according to [Equation 1] below:

$$\begin{bmatrix} Xm \\ Ym \\ Zm \end{bmatrix} = \frac{1}{0.177} \begin{bmatrix} 0.49 & 0.31 & 0.31 \\ 0.18 & 0.81 & 0.01 \\ 0.00 & 0.01 & 0.99 \end{bmatrix} \begin{bmatrix} RI \\ GI \\ BI \end{bmatrix}, \quad [\text{Equation 1}]$$

where (Xm, Ym, Zm) indicates the input tristimulus value, and (RI, GI, BI) indicates the input image data having the red color data, the green color data, and the blue color data.

The mixed color coordinate calculator 520 may calculate the first color coordinate and the first luminance value based on the input tristimulus value (Xm, Ym, Zm). In one example embodiment, the mixed color coordinate calculator 520 may calculate the first color coordinate and the first luminance value corresponding to the CIE 1931 color space chromaticity diagram. For example, the mixed color coordinate calculator 520 may calculate the first color coordinate according to following [Equation 2] and may derive the first luminance value from the input tristimulus value (Xm, Ym, Zm) (e.g., set the first luminance value to Ym).

$$xm = \frac{Xm}{Xm + Ym + Zm}, \quad [\text{Equation 2}]$$
$$ym = \frac{Ym}{Xm + Ym + Zm},$$

where (xm, ym) indicates the first color coordinate.

The mixed color coordinate calculator 520 may receive the second color coordinate (xa, ya) and the second luminance value m2 from the light sensor 10 included in the display panel. The mixed color coordinate calculator 520 may calculate the mixed color coordinate (xma, yma) of the mixed light of the image light and the external light based on the luminance ratio of a second luminance value of the external light to a first luminance value of the image light. Here, the mixed color coordinate may be located on a line connecting the first color coordinate to the second color coordinate (xa, ya).

In one example embodiment, as shown in FIG. 6, a distance ratio of a second distance D2 between the mixed color coordinate C3 and the second color coordinate C2 to a first distance D1 between the mixed color coordinate C3 and the first color coordinate C1 may be inversely proportional to the luminance ratio. For example, the mixed color coordinate calculator 520 may set the mixed color coordinate C3 to a center of mass of the first luminance value and the second luminance value on the line connecting the first color coordinate C1 to the second color coordinate C2.

Specifically, when the first color coordinate C1 is (xm, ym, zm), the first luminance value is m1, the second color coordinate C2 is (xa, ya, za), and the second luminance value is m2, a tristimulus value of the mixed light may be calculated according to [Equation 3] below:

$$Xma = \frac{m1\ xm}{L\ ym} + \frac{m2\ xa}{L\ ya}, \quad [\text{Equation 3}]$$
$$Yma = \frac{m1\ ym}{L\ ym} + \frac{m2\ ya}{L\ ya},$$

-continued $$Zma = \frac{m1}{L}\frac{zm}{ym} + \frac{m2}{L}\frac{za}{ya},$$

where (Xma, Yma, Zma) indicates the tristimulus value of the mixed light, m1 indicates the first luminance value of the image light, m2 indicates the second luminance value of the external light, and L indicates a constant for matching ym or ya to the luminance value.

In this case, because 'xm+ym+zm=1' and 'xa+ya+za=1', the following [Equation 4] is derived from [Equation 3].

$$Xma + Yma + Zma = \frac{m1}{L\ ym} + \frac{m2}{L\ ya} \qquad \text{[Equation 4]}$$

Therefore, the mixed color coordinate (xma, yma) of the mixed light may be calculated according to [Equation 5] below:

$$xma = \frac{Xma}{Xma + Yma + Zma} = \frac{\frac{xm}{ym} + \frac{(m2/m1)xa}{ya}}{\frac{1}{ym} + \frac{(m2/m1)}{ya}}, \qquad \text{[Equation 5]}$$

$$yma = \frac{Yma}{Xma + Yma + Zma} = \frac{1 + (m2/m1)}{\frac{1}{ym} + \frac{(m2/m1)}{ya}},$$

where (xma, yma) indicates the mixed color coordinate.

In one example embodiment, the mixed color coordinate calculator 520 may adjust the second luminance value based on a transmissivity of the transmitting region. Thus, the transmissivity of the transmitting region may be reflected in the luminance value of the external light because the mixed light recognized by the user is affected by the external light passing through the transmitting region of the display device. For example, the mixed color coordinate calculator 520 may calculate the mixed color coordinate (xma, yma) according to [Equation 6] below:

$$xma = \frac{\frac{xm}{ym} + \frac{(m2/m1)SR\ xa}{ya}}{\frac{1}{ym} + \frac{(m2/m1)SR}{ya}}, \qquad \text{[Equation 6]}$$

$$yma = \frac{1 + (m2/m1)SR}{\frac{1}{ym} + \frac{(m2/m1)SR}{ya}},$$

where, SR indicates the transmissivity of the transmitting region.

In one example embodiment, the display panel may be divided into a plurality of display regions, and the mixed color coordinate calculator 520 may receive the second color coordinate (xa, ya) and the second luminance value m2 from the light sensor 10 of the display region corresponding to the input image data. Accordingly, the mixed color coordinate calculator 520 may calculate the mixed coordinate (xma, yma) based on the luminance value and color coordinate of the external light changed according to the position of the display panel.

In one example embodiment, the mixed color coordinate calculator 520 may periodically receive the second color coordinate (xa, ya) and the second luminance value m2 and calculate the mixed coordinate (xma, yma) according to the change in the external light.

The virtual color coordinate calculator 530 may calculate a virtual color coordinate (xc, yc) by adding the first color coordinate to a difference value between the first color coordinate and the mixed color coordinate (xma, yma). For example, the virtual color coordinate calculator 530 may calculate the virtual color coordinate (xc, yc) using [Equation 7].

$$xc = xm + (xm - xma),$$

$$yc = ym + (ym - yma) \qquad \text{[Equation 7]}$$

In one example embodiment, the virtual color coordinate calculator 530 may adjust the virtual color coordinate (xc, yc) by multiplying the virtual color coordinate and a gain value, thereby preventing an excessive distortion occurred when the recognition color gamut is compensated.

$$xc = (xm + (xm - xma))\alpha,$$

$$yc = (ym + (ym - yma))\alpha \qquad \text{[Equation 8]}$$

where, α indicates the gain value that is greater than 0 and lesser than or equal to 1.

As shown in FIG. 7, the virtual color coordinate calculator 530 may calculate the virtual color coordinate (xc, yc) corresponding to the input image data (RI, GI, BI), thereby compensating the recognition color gamut that is decreased by the external light. Accordingly, the compensated color gamut of the image light may increase. For example, the first recognition color gamut G1 of FIG. 4B may be changed into a first compensated recognition color gamut G1', and the second recognition color gamut G2 of FIG. 4B may be changed into a second compensated recognition color gamut G2'.

The converted tristimulus value calculator 540 may calculate a converted tristimulus value (Xm', Ym', Zm') based on the virtual color coordinate (xc, yc). For example, the converted tristimulus value calculator 540 may derive the converted tristimulus value (Xm', Ym', Zm') from the virtual color coordinate (xc, yc) and the first luminance value using [Equation 2].

The second format converter 550 may convert the converted tristimulus value (Xm', Ym', Zm') into the output image data (RO, GO, BO). For example, the second format converter 550 may convert the converted tristimulus value (Xm', Ym', Zm') into the output image data (RO, GO, BO) using [Equation 1].

Although the first color coordinate and the second color coordinate of the example embodiments of FIG. 5 are described as corresponding to CIE 1931 color space chromaticity diagram, it is not limited thereto. For example, the first color coordinate and the second color coordinate may correspond to CIE 1976 color space chromaticity diagram.

Figure 8:
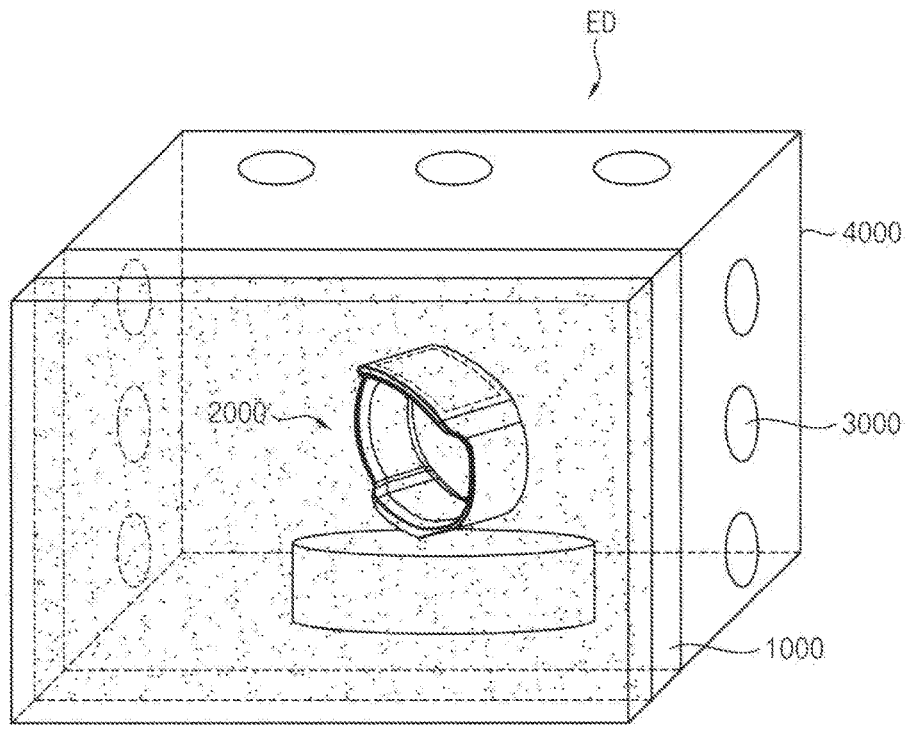
FIGS. 8 and 9 are diagrams illustrating an electronic device according to example embodiments.
Figure 9:
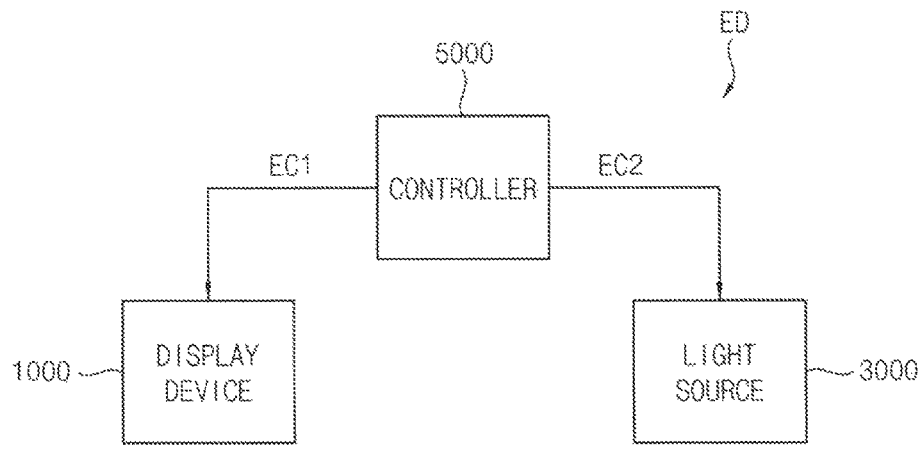

FIGS. 8 and 9 are diagrams illustrating an electronic device according to example embodiments.

Referring to FIGS. 8 and 9, the electronic device ED may include a display device 1000, a light source 3000, a housing 4000, and a controller 5000. Here, the electronic device ED may be an electronic device for an advertisement, and an exhibit 2000 located backside of the display device 1000, and an image displayed by the display device 1000 can be recognized by user.

The display device 1000 may be a transparent display device including a pixel region emitting an image light and a transmitting region through which a back light passes. The display device 1000 may compensate a recognition color gamut of the image light that decreases owing to the back light passing through the transmitting region, thereby preventing a saturation decrease of the mixed light and improving the visibility of the display device. In one example embodiment, the display device 1000 may include a light blocking portion adjusting a transmissivity of the transmitting region.

The light source 3000 may be disposed on at least one side of the housing 4000 and may emit the back light. For example, the light source 3000 may be evenly or symmetrically disposed on a plurality of sides of the housing 4000 such that the back light is evenly incident on the exhibit 2000.

The housing 4000 may accommodate the display device 1000 and the light source 3000. The display device 1000 may be located in front of the housing 4000. The housing 4000 may include a space located behind the display device 1000, and the exhibit 2000 may be on display in the space.

The controller 5000 may control the display device 1000 and the light source 3000. In one example embodiment, the controller 5000 may provide a second control signal EC2 for adjusting the second luminance value of the back light to the light source and provide the adjusted second luminance value to the display device 1000. In one example embodiment, the controller 5000 may provide a first control signal EC1 for adjusting the transmissivity of the transmitting region based on the second luminance value to the display device 1000.

Figure 10:
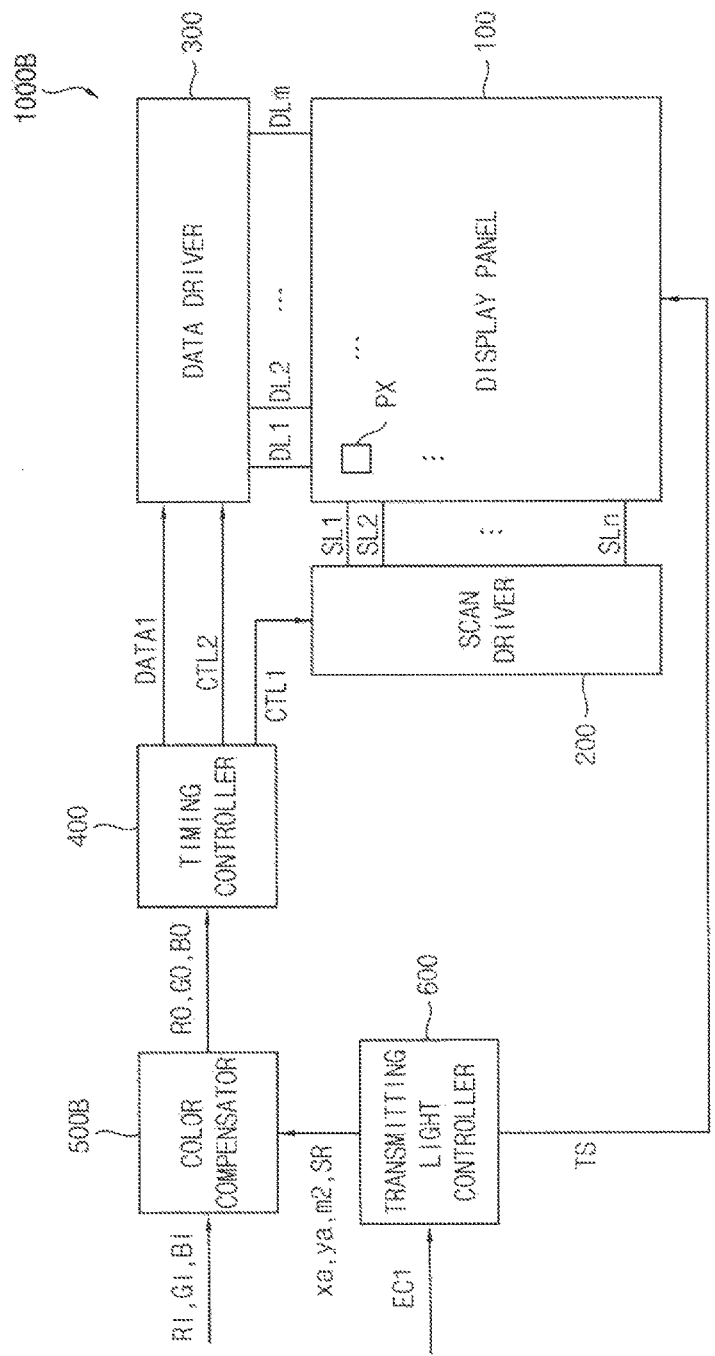
FIG. 10 is a block diagram illustrating an example of a display device included in an electronic device of FIG. 8.

FIG. 10 is a block diagram illustrating an example of a display device included in an electronic device of FIG. 8.

Referring to FIG. 10, the display device 1000B may include a display panel 100, a panel driver, a color compensator 500B, and a transmitting light controller 600. The display device 1000B according to the present exemplary embodiment is substantially the same as the display device of the exemplary embodiment described in FIG. 1 except that the transmitting light controller 600 is added. Therefore, the same reference numerals are used to refer to the same or like parts as those described in the previous exemplary embodiment of FIG. 1, and any repetitive explanation concerning the above elements is omitted.

The display panel 100 may include a plurality of pixels PX. The pixel PX may include a pixel region having an OLED emitting the image light and a transmitting region having a transmitting window through which the back light passes. In one example embodiment, the display panel 100 may include a light blocking portion adjusting a transmissivity of the transmitting region.

The panel driver may provide a driving signal to the display panel 100 to display an image corresponding to the output image data (RO, GO, BO). The panel driver may include a scan driver 200, a data driver 300, and a timing controller 400.

The color compensator 500B may receive input image data (RI, GI, BI) and compensate the input image data (RI, GI, BI) by as much as a decrease of a recognition color gamut caused by the back light to generate the output image data (RO, GO, BO). Thus, the color compensator 500B may calculate a mixed color coordinate of a mixed light of an image light and a back light based on the first color coordinate of a image light, the second color coordinate of the back light, and a luminance ratio of the second luminance value of the back light to the first luminance value of the image light. The color compensator 500B may compensate the first color coordinate based on the mixed color coordinate to generate the output image data (RO, GO, BO).

The transmitting light controller 600 may receive a first control signal EC1 having the second color coordinate, the second luminance value of the back light, and the transmissivity of the transmitting region. The transmitting light controller 600 may provide a light blocking signal TS for adjusting the transmissivity of the transmitting region to the light blocking portion of the display panel 100. Thus, the transmitting light controller 600 may adjust the visibility for the image displayed by the display device 1000B and the exhibit located backside of the display device 1000B. For example, the transmitting light controller 600 may decrease the transmissivity of the transmitting region such that the displayed image is clearly recognized by the user. On the other hand, the transmitting light controller 600 may increase the transmissivity of the transmitting region such that the exhibit is clearly recognized by the user. In one example embodiment, the display panel 100 may be divided into a plurality of display regions, and the transmitting light controller 600 may provide the light blocking signal TS such that the light blocking portion adjusts the transmissivity corresponding to the display regions, respectively. In addition, the transmitting light controller 600 may provide the color compensator 500B the second color coordinate (xa, ya), the second luminance value m2, and the transmissivity SR of the transmitting region to the color compensator 500B.

Figure 11:
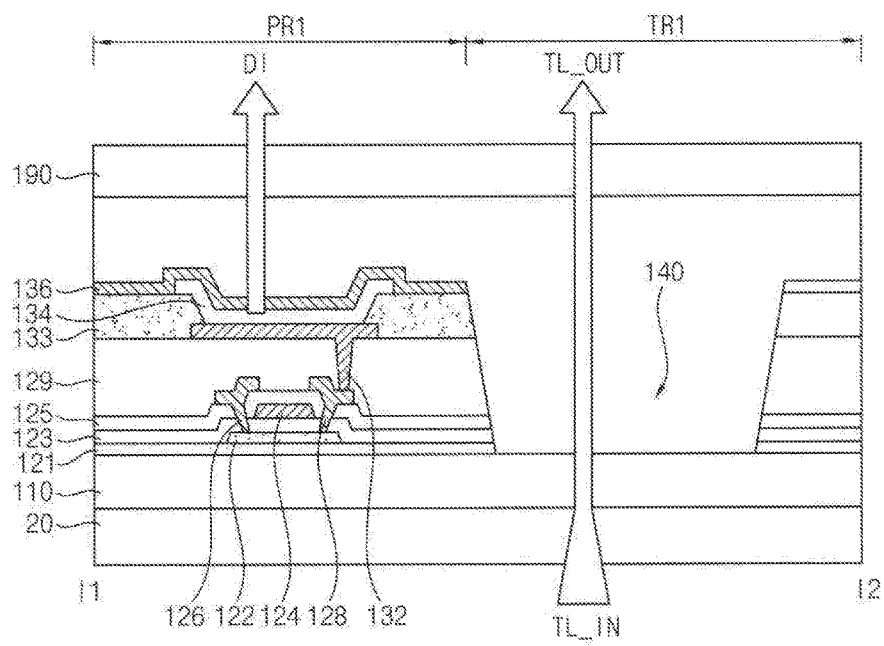
FIG. 11 is a diagram illustrating an example of a pixel included in a display device of FIG. 10.

FIG. 11 is a diagram illustrating an example of a pixel included in a display device of FIG. 10.

Referring to FIG. 11, the display device may include a first substrate 110, a display unit, a second substrate 190, and a light blocking portion 20. The display device according to the present exemplary embodiment is substantially the same as the display device of the exemplary embodiment described in FIG. 3 except that the light blocking portion 20 is added instead of the light sensor. Therefore, the same reference numerals are used to refer to the same or like parts as those described in the previous exemplary embodiment of FIG. 3, and any repetitive explanation concerning the above elements is omitted.

The first substrate 110 and the second substrate 190 may include a glass substrate or a transparent plastic substrate.

The light blocking portion 20 may be disposed on one side of the first substrate 110 or the second substrate 190. In one example embodiment, the light blocking portion 20 may include a first polarizing layer, a first electrode, a liquid crystal layer, a second electrode, and a second polarizing layer. The light transmission axes of the first and second polarizing layers may be orthogonal to each other. The light blocking portion 20 may control voltages applied to the first and second electrode to adjust the transmissivity of the transmitting region (i.e., to adjust a ratio of output back light TL_OUT to input back light TL_IN). In addition, the light blocking portion 20 may have a variety of structures capable of adjusting the transmissivity of the transmitting region.

The display unit may be disposed between the first substrate 110 and the second substrate 190. The display unit may include a pixel having a sub-pixel and a transparent window 140. The sub-pixel may include a TFT and an OLED electrically connected to the TFT. The OLED may be disposed on the pixel region PR1 and emit image light DI to display image. The transparent window 140 may be disposed on the transmitting region TR and transmit the output back light TL_OUT adjusted by the light blocking portion 20.

Figure 12:
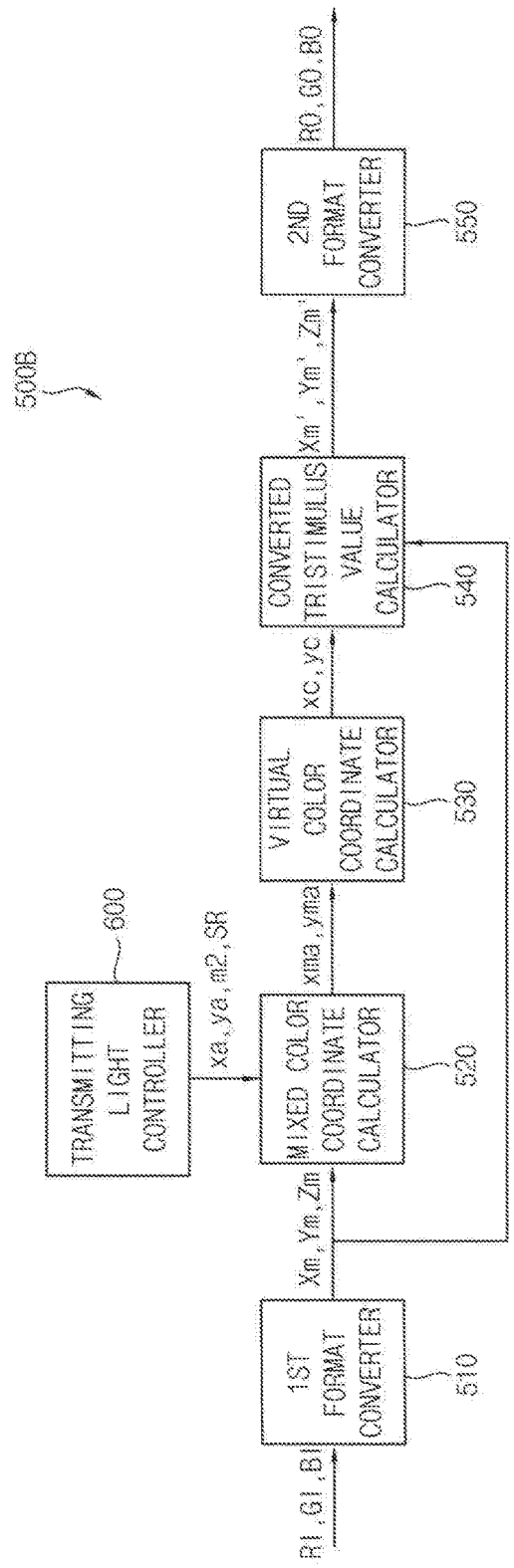
FIG. 12 is a diagram illustrating an example of a color compensator included in a display device of FIG. 10.

FIG. 12 is a diagram illustrating an example of a color compensator included in a display device of FIG. 10.

Referring to FIG. 12, the color compensator 500B may include a first format converter 510, a mixed color coordinate calculator 520, a virtual color coordinate calculator 530, a converted tristimulus value calculator 540, a second format converter 550. The color compensator 500B according to the present exemplary embodiment is substantially the same as the color compensator of the exemplary embodiment described in FIG. 5 except that the mixed color coordinate calculator 520 receives the second color coordinate (xa, ya), the second luminance value m2, and the transmissivity SR of the transmitting region from the transmitting light controller 600. Therefore, the same reference numerals are used to refer to the same or like parts as those described in the previous exemplary embodiment of FIG. 5, and any repetitive explanation concerning the above elements is omitted.

The first format converter 510 may convert an input image data (RI, GI, BI) into an input tristimulus value (Xm, Ym, Zm).

The mixed color coordinate calculator 520 may calculate the first color coordinate and the first luminance value based on the input tristimulus value (Xm, Ym, Zm). The mixed color coordinate calculator 520 may receive the second color coordinate (xa, ya), the second luminance value m2, and the transmissivity SR of the transmitting region from the transmitting light controller 600. The mixed color coordinate calculator 520 may calculate the mixed color coordinate (xma, yma) of the mixed light of the image light and the back light based on a luminance ratio of the second luminance value of the back light to the first luminance value of the image light. Here, the mixed color coordinate may be located on a line connecting the first color coordinate to the second color coordinate (xa, ya). For example, the mixed color coordinate calculator 520 may calculate the mixed color coordinate (xma, yma) according to above [Equation 6].

In one example embodiment, the display panel may be divided into a plurality of display regions, and the mixed color coordinate calculator 520 may receive the second color coordinate (xa, ya) and the second luminance value m2, and the transmissivity SR of the transmitting region of the display region corresponding to the input image data from the transmitting light controller 600. Accordingly, the mixed color coordinate calculator 520 may calculate the mixed color coordinate (xma, yma) using information of the external light according to the position of the display panel.

The virtual color coordinate calculator 530 may calculate a virtual color coordinate (xc, yc) by adding the first color coordinate to a difference value between the first color coordinate and the mixed color coordinate (xma, yma).

The converted tristimulus value calculator 540 may calculate a converted tristimulus value (Xm', Ym', Zm') based on the virtual color coordinate (xc, yc).

The second format converter 550 may convert the converted tristimulus value (Xm', Ym', Zm') into the output image data (RO, GO, BO).

Figure 13:
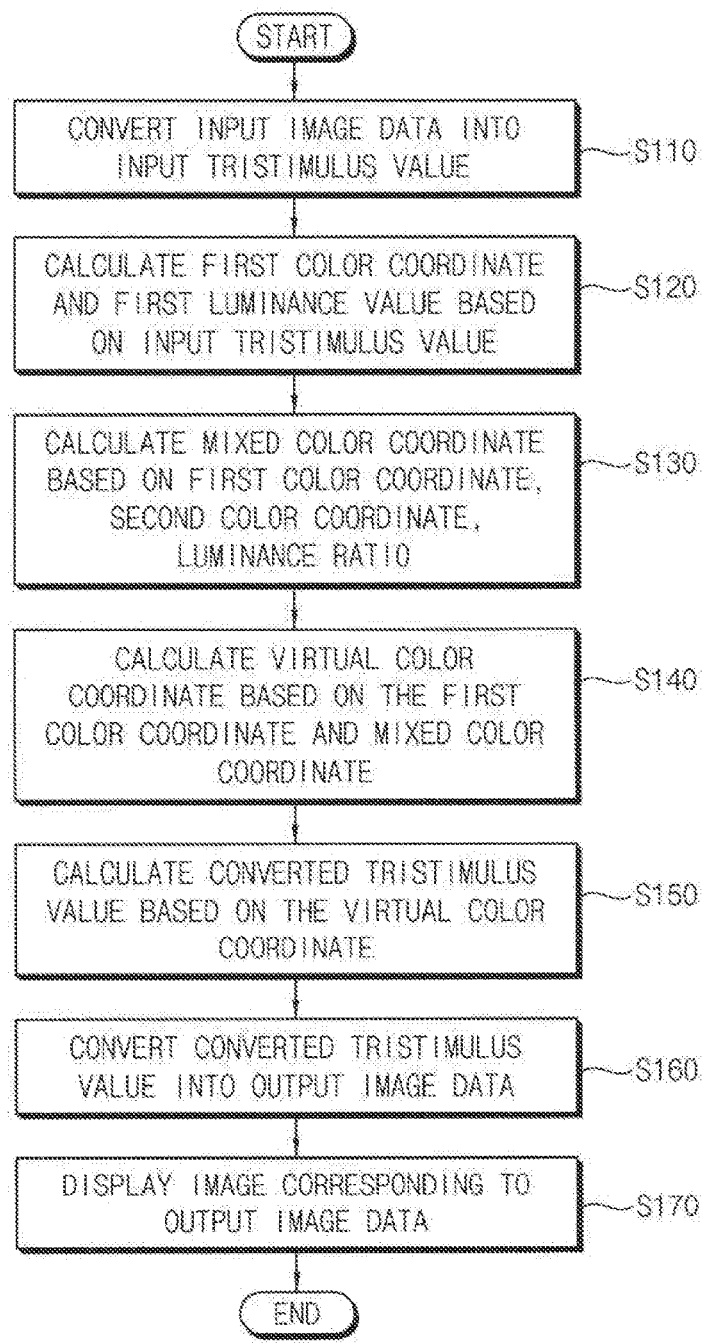
FIG. 13 is a flow chart illustrating a method of driving a display device according to example embodiments.

FIG. 13 is a flow chart illustrating a method of driving a display device according to example embodiments.

Referring to FIG. 13, a method of driving a display device may calculate a mixed color coordinate of a mixed light of an image light and an external light and may compensate a recognition color gamut of the image light decreased owing to the external light based on the mixed color coordinate.

An input image data may be converted into an input tristimulus value (S110). In one example embodiment, the input image data may correspond to RGB format and may be converted into the input tristimulus value using a conversion matrix. For example, the input image data may be converted into the input tristimulus value according to above [Equation 1].

The first color coordinate and the first luminance value of the image light may be calculated based on the input tristimulus value (S120). In one example embodiment, the first color coordinate and the first luminance value may correspond to the CIE 1931 color space chromaticity diagram or the CIE 1976 color space chromaticity diagram.

The mixed color coordinate of the mixed light may be calculated based on the luminance ratio of a second luminance value of the external light to a first luminance value of the image light (S130). Here, the mixed color coordinate may be included in a line connecting the first color coordinate to the second color coordinate. In one example embodiment, the second color coordinate and the second luminance value may be derived from the light sensor. In one example embodiment, the second color coordinate and the second luminance value may be periodically updated. In one example embodiment, a distance ratio of a second distance between the mixed color coordinate and the second color coordinate to a first distance between the mixed color coordinate and the first color coordinate may be inversely proportional to the luminance ratio. In one example embodiment, the second luminance value may be adjusted based on a transmissivity of the transmitting region. For example, the mixed color coordinate may be calculated according to above [Equation 6]. Because a method of calculating the mixed color coordinate is described above, duplicated descriptions are omitted.

The virtual color coordinate may be calculated by adding the first color coordinate to a difference value between the first color coordinate and the mixed color coordinate (S140). In one example embodiment, the virtual color coordinate may be adjusted by multiplying the virtual color coordinate and a gain value. For example, the virtual color coordinate may be calculated according to above [Equation 8].

The output image data may be generated based on the virtual color coordinate, and an image corresponding to the output image data may be displayed. For example, a converted tristimulus value may be calculated based on the virtual color coordinate (S150), the converted tristimulus value may be converted into the output image data (S160), and then the image corresponding to the output image data may be displayed (S170).

Although a display device, a method of driving the display device, and an electronic device having the display device according to example embodiments have been described with reference to figures, those skilled in the art would readily appreciate that many modifications are possible in the example embodiments without materially departing from the novel teachings and advantages of the present inventive concept. For example, although the example embodiments describe that each pixel includes the transmitting region, the transmitting region may be located in various positions.

The present inventive concept may be applied to an electronic device including a display device. For example, the present inventive concept may be applied to an electronic billboard, a digital signage, a personal computer, a note book computer, a cellular phone, a smart phone, a smart pad, a personal digital assistant (PDA), etc.

The foregoing is illustrative of example embodiments and is not to be construed as limiting thereof. Although a few example embodiments have been described, those skilled in the art would readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A display device comprising:
    a display panel including a plurality of pixels;
    a color compensator configured to calculate a mixed color coordinate of a mixed light of an image light and an external light based on a first color coordinate of the image light, a second color coordinate of the external light, and a luminance ratio of a second luminance value of the external light to a first luminance value of the image light and configured to compensate the first color coordinate based on the mixed color coordinate to generate an output image data; and
    a panel driver configured to provide a driving signal to the display panel to display an image corresponding to the output image data
    wherein the color compensator includes:
        a first format converter configured to convert an input image data into an input tristimulus value;
        a mixed color coordinate calculator configured to calculate the first color coordinate and the first luminance value based on the input tristimulus value and configured to calculate the mixed color coordinate based on the luminance ratio, the mixed color coordinate located on a line connecting the first color coordinate to the second color coordinate;
        a virtual color coordinate calculator configured to calculate a virtual color coordinate by adding the first color coordinate to a difference value between the first color coordinate and the mixed color coordinate;
        a converted tristimulus value calculator configured to calculate a converted tristimulus value based on the virtual color coordinate; and
        a second format converter configured to convert the converted tristimulus value into the output image data
    wherein a distance ratio of a second distance between the mixed color coordinate and the second color coordinate to a first distance between the mixed color coordinate and the first color coordinate is inversely proportional to the luminance ratio.

2. The display device of claim 1, wherein the mixed color coordinate calculator receives the second color coordinate and the second luminance value from a light sensor included in the display panel.

3. The display device of claim 1, wherein the display panel is divided into a plurality of display regions on which a plurality of light sensors are disposed, respectively, and
    wherein the mixed color coordinate calculator receives the second color coordinate and the second luminance value from the light sensors.

4. The display device of claim 1, wherein the mixed color coordinate calculator periodically receives the second color coordinate and the second luminance value.

5. The display device of claim 1, wherein each of the pixels includes:
    a pixel region having an organic light emitting diode emitting the image light; and
    a transmitting region having a transmitting window through which the external light passes.

6. The display device of claim 5, wherein the mixed color coordinate calculator adjusts the second luminance value based on a transmissivity of the transmitting region.

7. The display device of claim 5, wherein the display panel further includes:
    a light blocking portion configured to adjust a transmissivity of the transmitting region.

8. The display device of claim 7, wherein the display panel is divided into a plurality of display regions, and
    wherein the light blocking portion adjusts the transmissivity corresponding to display regions, respectively.

9. The display device of claim 1, wherein the virtual color coordinate calculator adjusts the virtual color coordinate by multiplying the virtual color coordinate and a gain value.

10. A method of driving a display device, the display device including a pixel region emitting an image light and a transmitting region through which an external light passes, comprising:
    converting an input image data into an input tristimulus value;
    calculating a first color coordinate of the image light and a first luminance value of the image light based on the input tristimulus value;
    calculating a mixed color coordinate of a mixed light of the image light and the external light based on a luminance ratio of a second luminance value of the external light to the first luminance value, the mixed color coordinate located on a line connecting the first color coordinate to a second color coordinate of the external light;
    calculating a virtual color coordinate by adding the first color coordinate to a difference value between the first color coordinate and the mixed color coordinate; and
    generating an output image data based on the virtual color coordinate to display an image corresponding to the output image data,
    wherein a distance ratio of a second distance between the mixed color coordinate and the second color coordinate to a first distance between the mixed color coordinate and the first color coordinate is inversely proportional to the luminance ratio.

11. The method of claim 10, wherein the second color coordinate and the second luminance value are derived from a light sensor included in the display device.

12. The method of claim 10, wherein the second color coordinate and the second luminance value are periodically updated.

13. The method of claim 10, wherein the second luminance value is adjusted based on a transmissivity of the transmitting window.

14. The method of claim 10, wherein the virtual color coordinate is adjusted by multiplying the virtual color coordinate and a gain value.

* * * * *